(12) United States Patent
Zhu et al.

(10) Patent No.: US 7,553,709 B2
(45) Date of Patent: Jun. 30, 2009

(54) MOSFET WITH BODY CONTACTS

(75) Inventors: Huilong Zhu, Poughkeepsie, NY (US); Zhijiong Luo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 450 days.

(21) Appl. No.: 11/538,560

(22) Filed: Oct. 4, 2006

(65) Prior Publication Data

US 2008/0083949 A1    Apr. 10, 2008

(51) Int. Cl.
*H01L 21/00* (2006.01)

(52) U.S. Cl. .............. 438/149; 438/479; 438/517; 257/347

(58) Field of Classification Search ......... 438/149–152, 438/479, 517; 257/347, 349–351, 373, 377, 257/382, 412
See application file for complete search history.

(56) References Cited

U.S. PATENT DOCUMENTS

| | | | |
|---|---|---|---|
| 5,872,383 A * | 2/1999 | Yagishita | .............. 257/409 |
| 5,962,895 A | 10/1999 | Beyer et al. | |
| 6,387,739 B1 | 5/2002 | Smith, III | |
| 6,724,048 B2 | 4/2004 | Min et al. | |

* cited by examiner

*Primary Examiner*—Thinh T Nguyen
(74) *Attorney, Agent, or Firm*—Scully, Scott, Murphy & Presser, P.C.; H. Daniel Schnurmann

(57) ABSTRACT

A semiconductor structure includes a metal oxide semiconductor field effect transistor that includes a body contact region that extends from body region located beneath a channel region that separates a pair of source/drain regions within the metal oxide semiconductor field effect transistor. The body contact region is recessed with respect to a surface of the channel region to avoid shorting between a body contact and the source/drain regions.

1 Claim, 8 Drawing Sheets

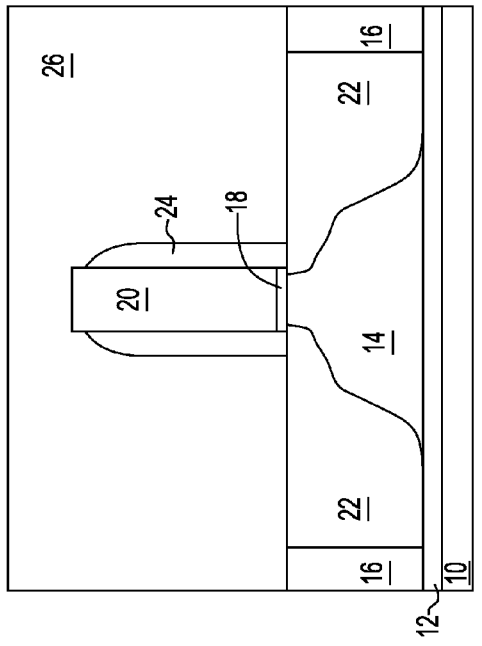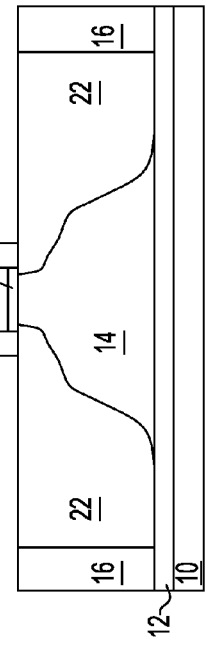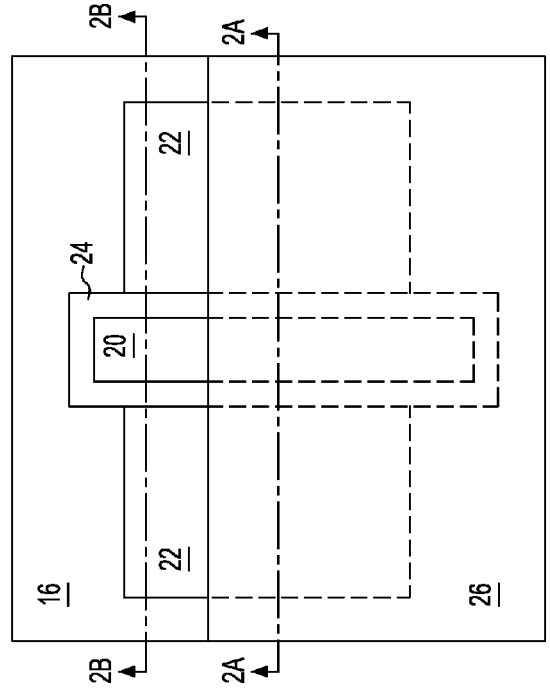

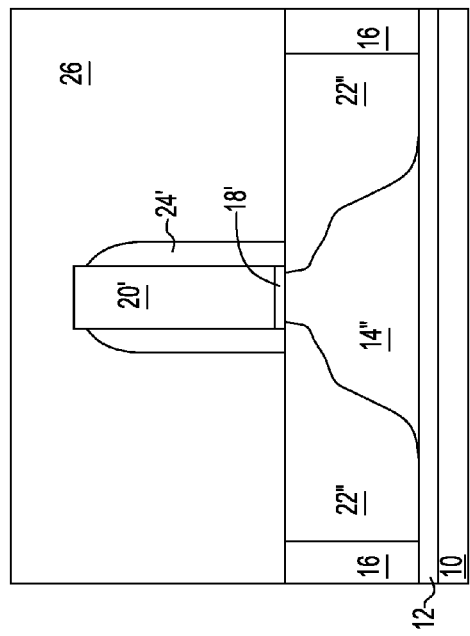
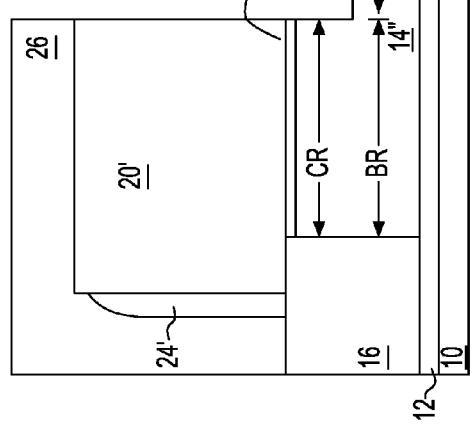
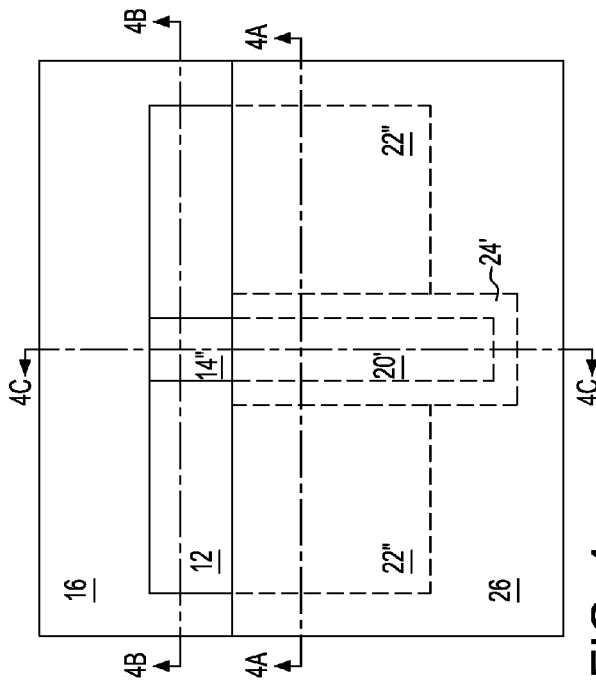
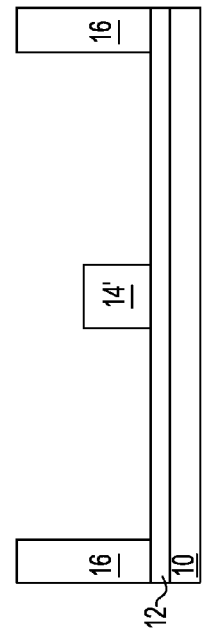
FIG. 4A
FIG. 4C
FIG. 4
FIG. 4B

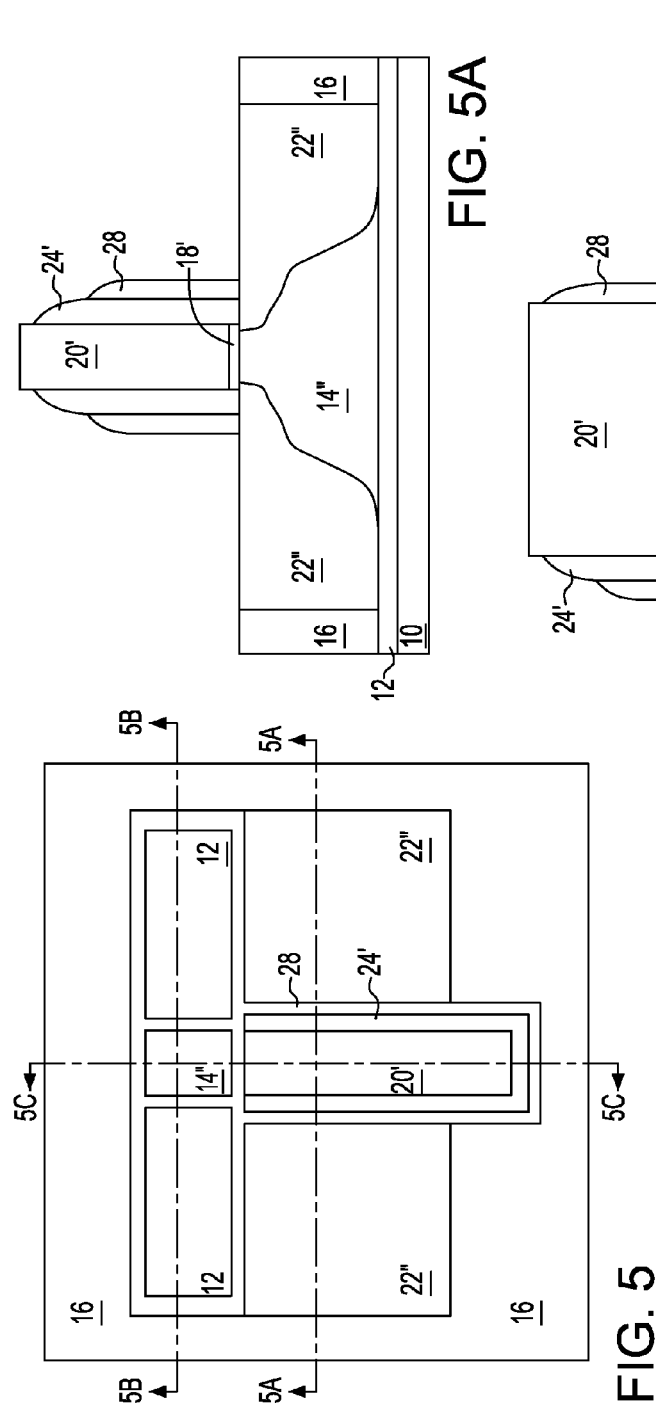

MOSFET WITH BODY CONTACTS

BACKGROUND

1. Field of the Invention

The invention relates generally to semiconductor structures. More particularly, the invention relates to semiconductor structures with enhanced performance and reliability.

2. Description of the Related Art

Recent advances in semiconductor technology have included the use of semiconductor-on-insulator substrates when fabricating semiconductor devices. Semiconductor-on-insulator substrates are desirable insofar as semiconductor-on-insulator substrates provide for superior semiconductor device isolation, and also for uniformly thinner channel regions within semiconductor devices.

Although semiconductor-on-insulator substrates are thus often essential in semiconductor device fabrication to provide enhanced performance semiconductor devices, devices fabricated within semiconductor-on-insulator substrates are nonetheless not entirely without difficulties. In particular, due to the superior isolation capabilities of semiconductor-on-insulator substrates, semiconductor devices formed using semiconductor-on-insulator substrates experience what is generally described as a floating body effect. A floating body effect within a semiconductor device often causes for a threshold voltage shifting within the semiconductor device. Such a floating body effect also provides for soft errors within field effect devices such as metal oxide semiconductor field effect transistors fabricated using semiconductor-on-insulator substrates.

Various semiconductor structures having desirable properties are known in the semiconductor fabrication art.

For example, Beyer et al., in U.S. Pat. No. 5,962,895, teaches a metal oxide semiconductor field effect transistor efficiently fabricated within a semiconductor-on-insulator substrate, and including a body contact. To realize the foregoing result, the body contact within the metal oxide semiconductor field effect transistor is fabricated using a self-aligned method.

In addition, Smith III, in U.S. Pat. No. 6,387,739, also teaches a metal oxide semiconductor field effect transistor including a body contact. The body contact within this metal oxide semiconductor field effect transistor is fabricated absent overlay tolerance. To realize the foregoing result, the invention uses the dimension of an active area for determining a transistor width on one side, but by contrast the dimension of a gate conductor for determining the transistor width on another side, when a source and drain are connected together within the transistor.

Finally, Min et al., in U.S. Pat. No. 6,724,048, also teaches a field effect transistor that includes a body contact, and is otherwise fabricated with improved electrical properties. The inventive field effect transistor realizes the foregoing result by using a gate dielectric layer that includes variable thicknesses.

Semiconductor device and structure dimensions are certain to continue to decrease, and as a result thereof desirable are semiconductor devices, such as metal oxide semiconductor field effect transistor devices, that may be fabricated with enhanced performance while using semiconductor-on-insulator substrates.

SUMMARY OF THE INVENTION

The invention includes a semiconductor structure and a method for fabricating the semiconductor structure. The semiconductor structure and the method for fabricating the semiconductor structure include use of a body contact region. The body contact region is recessed with respect to a surface of a channel region located over a body region within the semiconductor structure to avoid electrical shorting between the body contact region and source/drain regions (in particular source/drain region extensions) within the semiconductor structure.

A semiconductor structure in accordance with the invention includes an active semiconductor region located over a substrate. The semiconductor structure also includes a gate electrode located over a channel region located over a body region within the active semiconductor region and separating a pair of source/drain regions including a pair of extension regions within the active semiconductor region. The semiconductor structure also includes a body contact region extending from the body region and recessed from a surface of the channel region to beneath the pair of extension regions.

Another semiconductor structure in accordance with the invention also includes an active semiconductor region located over a substrate. This other semiconductor structure also includes a gate electrode located over a channel region that is located over a body region within the active semiconductor region and separating a pair of source/drain regions within the active semiconductor region. This other semiconductor structure also includes a body contact region extending from the body region and recessed beneath a surface of the channel region. This other semiconductor structure also includes a silicide layer located upon the body contact region.

A method for fabricating a semiconductor structure in accordance with the invention includes forming a metal oxide semiconductor field effect transistor over a substrate. The metal oxide semiconductor field effect transistor includes a gate electrode located over a body region and an overlying channel region within a semiconductor layer that separates a pair of source/drain regions located within the semiconductor layer. This particular method also includes masking a portion of the metal oxide semiconductor field effect transistor to leave exposed a portion of the source/drain regions and a portion of the gate electrode located over a portion of the channel region. This particular method also includes etching the exposed portions of the source/drain regions and the gate electrode, and the underlying channel region, to form a body contact region extending from the body region and recessed with respect to a surface of the channel region.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein:

FIG. 1 to FIG. 7C show a series of schematic plan-view and cross-sectional diagrams illustrating the results of progressive stages in fabricating a semiconductor structure in accordance with an embodiment of the invention.

DESCRIPTION OF THE PREFERRED EMBODIMENT

The invention, which includes a semiconductor structure and a method for fabricating the semiconductor structure, is understood within the context of the description provided below. The description provided below is understood within the context of the drawings described above. Since the drawings are intended for illustrative purposes, the drawings are not necessarily drawn to scale.

Figure 1:
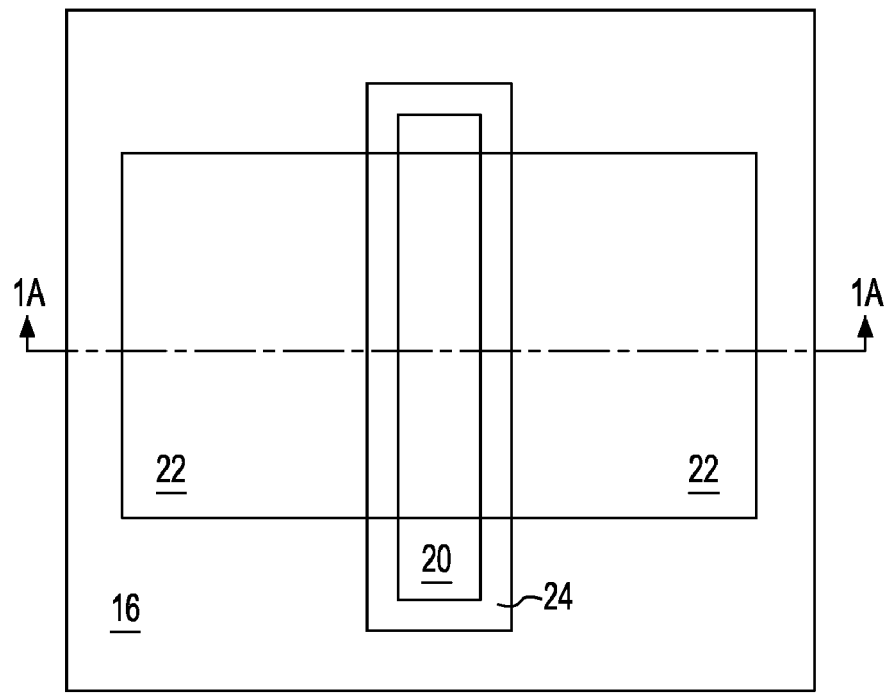

FIG. 1 to FIG. 7C show a series of schematic plan-view and cross-sectional diagrams illustrating the results of progressive stages in fabricating a semiconductor structure in accordance with an embodiment of the invention. This particular embodiment of the invention comprises a preferred embodiment of the invention. FIG. 1 shows a schematic plan-view diagram, and FIG. 1A shows a schematic cross-sectional diagram, of the semiconductor structure at an early stage in the fabrication thereof in accordance with the preferred embodiment.

Figure 1A:
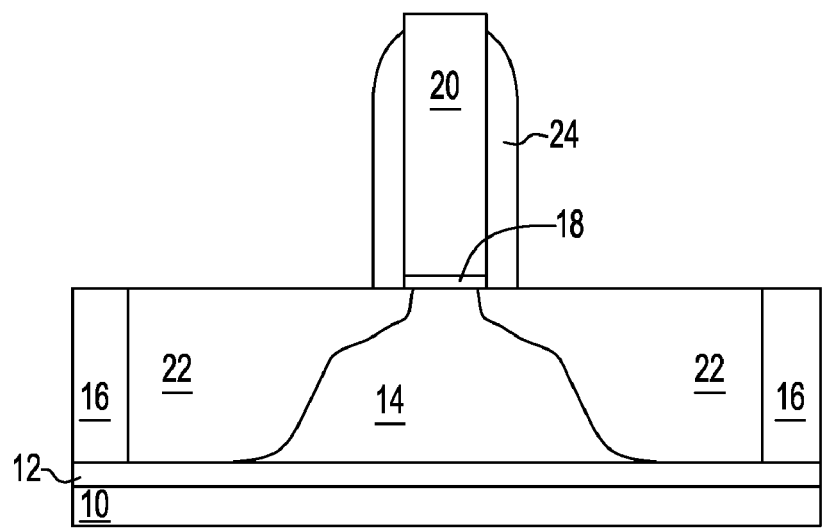

FIG. 1A in particular shows a base semiconductor substrate 10. A buried dielectric layer 12 is located upon the base semiconductor substrate 10, and a surface semiconductor layer 14 is located upon the buried dielectric layer 12. In an aggregate, the base semiconductor substrate 10, the buried dielectric layer 12 and the surface semiconductor layer 14 comprise a semiconductor-on-insulator substrate.

The base semiconductor substrate 10 may comprise any of several semiconductor materials. Non-limiting examples include silicon, germanium, silicon-germanium alloy, silicon carbide, silicon-germanium carbide alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 has a thickness from about 0.5 to about 1.5 mm.

The buried dielectric layer 12 may comprise any of several dielectric materials. Non-limiting examples include oxides, nitrides and oxynitrides, particularly of silicon, but oxides, nitrides and oxynitrides of other elements are not excluded. The buried dielectric layer 12 may comprise a crystalline or a non-crystalline dielectric material. Crystalline dielectric materials are generally highly preferred. The buried dielectric layer 12 may be formed using any of several methods. Non-limiting examples include ion implantation methods, thermal or plasma oxidation or nitridation methods, chemical vapor deposition methods and physical vapor deposition methods. Typically, the buried dielectric layer 12 comprises an oxide of the semiconductor material from which is comprised the base semiconductor substrate 10 (i.e., an oxide of the base semiconductor substrate 10). Typically, the buried dielectric layer 12 has a thickness from about 50 to about 200 angstroms.

The surface semiconductor layer 14 may comprise any of the several semiconductor materials from which the base semiconductor substrate 10 may be comprised. The surface semiconductor layer 14 and the base semiconductor substrate 10 may comprise either identical or different semiconductor materials with respect to chemical composition, dopant polarity, dopant concentration and crystallographic orientation. Typically, the surface semiconductor layer 14 has a thickness from about 500 to about 1200 angstroms.

The semiconductor-on-insulator substrate portion of the semiconductor structure that is illustrated in FIG. 1 may be fabricated using any of several methods. Non-limiting examples include lamination methods, layer transfer methods and separation by implantation of oxygen (SIMOX) methods.

Although the embodiment illustrates the invention within the context of a semiconductor-on-insulator substrate comprising the base semiconductor substrate 10, the buried dielectric layer 12 and the surface semiconductor layer 14, neither the embodiment nor the invention is so limited. Under certain circumstances, the embodiment also contemplates use of a hybrid orientation (HOT) substrate that has multiple crystallographic orientation regions within a single semiconductor substrate.

FIG. 1 and FIG. 1A also shows an isolation region 16 that surrounds an active region that is derived from the surface semiconductor layer 14. The isolation region 16 may comprise dielectric materials analogous, equivalent or identical to the dielectric materials from which is comprised the buried dielectric layer 12. The dielectric materials may also be formed using methods analogous, equivalent or identical to the methods that are used for forming the buried dielectric layer 12. Typically, the isolation region 16 has a thickness from about 200 to about 1000 angstroms.

FIG. 1 and FIG. 1A further also show a field effect transistor device located within and upon the surface semiconductor layer 14 of the semiconductor-on-insulator substrate. The field effect transistor device comprises: (1) a gate dielectric 18 located upon the surface semiconductor layer 14; (2) a gate electrode 20 located upon the gate dielectric 18; (3) a spacer layer 24 located surrounding the gate electrode 20 and the gate dielectric 18; (4) a pair of source/drain regions 22 located within the surface semiconductor layer 14. The pair of source/drain regions 22 is separated by a channel region that is aligned beneath the gate electrode 18.

Each of the foregoing layers and structures may comprise materials and have dimensions that are conventional in the semiconductor fabrication art. Each of the foregoing layers and structures may also be formed using methods that are conventional in the semiconductor fabrication art.

The gate dielectric 18 may comprise conventional dielectric materials such as oxides, nitrides and oxynitrides of silicon that have a dielectric constant from about 4 to about 20, measured in vacuum. Alternatively, the gate dielectric 16 may comprise generally higher dielectric constant dielectric materials having a dielectric constant from about 20 to at least about 100. Such higher dielectric constant dielectric materials may include, but are not limited to hafnium oxides, hafnium silicates, titanium oxides, barium-strontium-titantates (BSTs) and lead-zirconate-titanates (PZTs). The gate dielectric 16 may be formed using any of several methods that are appropriate to its material of composition. Included, but not limiting are thermal or plasma oxidation or nitridation methods, chemical vapor deposition methods and physical vapor deposition methods. Typically, the gate dielectric 16 comprises a thermal silicon oxide dielectric material that has a thickness from about 5 to about 70 angstroms.

The gate electrode 20 may comprise materials including, but not limited to certain metals, metal alloys, metal nitrides and metal silicides, as well as laminates thereof and composites thereof. The gate electrode 20 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrode 20 comprises a doped polysilicon material that has a thickness from about 50 to about 2000 angstroms.

The spacer layer 24 may comprise materials including, but not limited to conductor materials and dielectric materials. Conductor spacer materials are less common, but are nonetheless known. Dielectric spacer materials are more common. The spacer materials may be formed using methods analogous, equivalent or identical to the methods that are used for forming the buried dielectric layer 12. The spacer layer 24 is also formed with the distinctive inward pointing spacer shape by using a blanket layer deposition and anisotropic etchback method. Typically, the spacer 24 comprises a silicon nitride dielectric material, although the invention is not so limited.

Finally, the pair of source/drain regions 22 comprises a generally conventional n or p conductivity type dopant that will typically be either a phosphorus dopant and/or an arsenic dopant for n-type and boron and/or indium for p-type. As is understood by a person skilled in the art, the pair of source/drain regions 22 is formed using a two step ion implantation method. A first ion implantation process step within the method uses the gate electrode 20, absent the spacer 24, as a mask to form a pair of extension regions each of which extends beneath the spacer 24. A second ion implantation process step uses the gate electrode 20 and the spacer 24 as a mask to form the larger contact region portions of the pair of source/drain regions 22, while simultaneously incorporating the pair of extension regions. Dopant levels (i.e., n and p) are from about $1\times10^{19}$ to about $1\times10^{20}$ dopant atoms per cubic centimeter within each of the source/drain regions 22. Extension regions within the pair of source/drain regions 22 may under certain circumstances be more lightly doped than contact regions with the pair of source/drain regions, although such differential doping concentrations are not a requirement of the invention.

FIG. 2, FIG. 2A and FIG. 2B show the results of forming a mask layer 26 located covering a portion of the semiconductor structure of FIG. 1 and FIG. 1A. The mask layer 26 may in general comprise any of several mask materials, including but not limited to hard mask materials and photoresist mask materials. Preferably, the mask layer 26 comprises a photoresist mask material. The photoresist mask material may comprise photoresist materials selected from the group consisting of positive photoresist materials, negative photoresist materials and hybrid photoresist materials. Typically, the mask layer 26 comprises a positive photoresist material or a negative photoresist material that has a thickness from about 2000 to about 5000 angstroms.

Figure 3A:
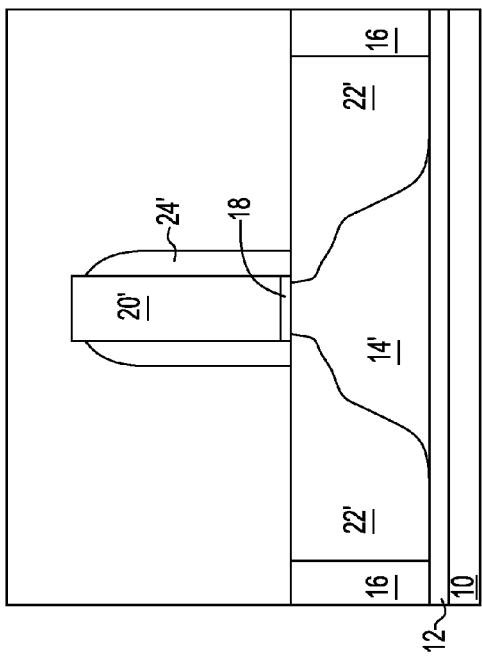
Figure 3B:
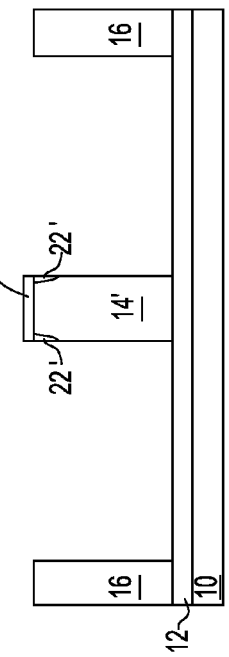
Figure 3:
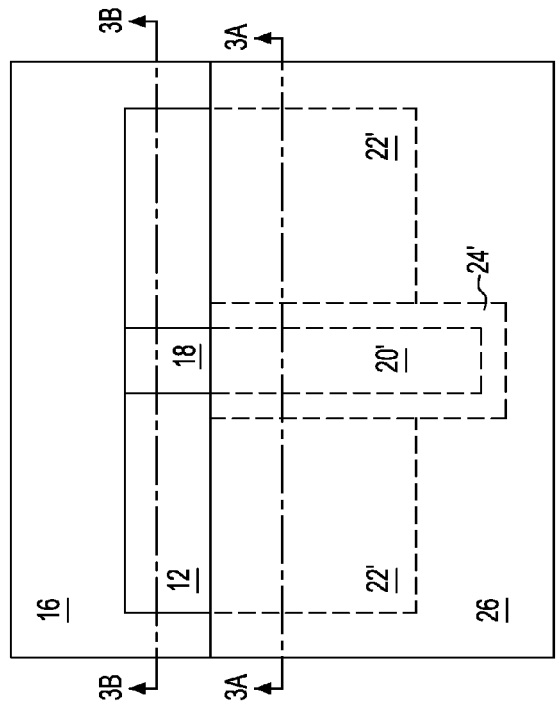

FIG. 3, FIG. 3A and FIG. 3B show the results of: (1) etching the spacer 24 to form a spacer 24'; (2) etching the gate electrode 20 to form a gate electrode 20'; (3) etching the surface semiconductor layer 14 to form a surface semiconductor layer 14' (which includes etching the source/drain regions 22 to form source/drain regions 22'). The foregoing etching utilizes the isolation region 16, the buried dielectric layer 12 and the gate dielectric 18 as etch stop layers.

The foregoing etching will typically use specifically engineered fluorine containing etchant gas composition for etching the spacer 24 when the spacer 24 is comprised of a silicon nitride material, in comparison with a silicon oxide material from which is preferably at least in-part comprised the isolation region 16, the buried dielectric layer 12 and the gate dielectric 18.

As is illustrated particularly within the schematic cross-sectional diagram of FIG. 3B, upon etching the surface semiconductor layer 14, there is left remaining a surface semiconductor layer 14' pedestal at the top edges of which are remaining extension region portions of the source/drain regions 22'.

FIG. 4, FIG. 4A, FIG. 4B and FIG. 4C show the results of further etching of exposed portions of the gate dielectric 18 and the surface semiconductor layer 14' (including the source/drain regions 22') to form a gate dielectric 18' and a surface semiconductor layer 14" (including source/drain regions 22"). The foregoing etching may be effected using methods that are conventional in the semiconductor fabrication art. With respect to etching the gate dielectric 18 to form the gate dielectric 18', the foregoing etching may be selective for etching the gate dielectric 18 to form the gate dielectric 18', with respect to the isolation region 16 and the buried dielectric layer 12, under circumstances where the gate dielectric 18 comprises a sufficiently different dielectric material in comparison with the isolation region 16 and the buried dielectric layer 12.

Etching of the surface semiconductor layer 14' to form the surface semiconductor layer 14" is generally effected while using an appropriate chlorine containing etchant gas composition. As is illustrated within the schematic cross-sectional diagram of FIG. 4C, the etching results in a recess R within the surface semiconductor layer 14" that forms a body contact region BCR of the surface semiconductor layer 14". The surface semiconductor layer 14" also includes a body region BR laterally adjoining the body contact region BCR and a channel region CR located above the body region BR. The recess R typically has a recess depth (i.e. from channel region CR surface to body contact region BCR surface) from about 200 to about 400 angstroms. Such a depth of the recess R is intended to provide for adequate isolation for a body contact (i.e., a contact stud) subsequently formed upon the recessed body contact region portion of the surface semiconductor layer 14" with respect to the source/drain regions 22", including in particular the extension regions. The recess R is formed absent any reoxidation of the surface semiconductor layer 14' when forming the surface semiconductor layer 14".

FIG. 5, FIG. 5A, FIG. 5B and FIG. 5C show the results of forming a second spacer 28 upon appropriate sidewalls of the semiconductor structure of FIG. 4, FIG. 4A, FIG. 4B and FIG. 4C. The appropriate sidewalls include isolation region 16 sidewalls, spacer 24' sidewalls, source/drain region 22" sidewalls and surface semiconductor layer 14" sidewalls.

The second spacer 28 may comprise materials, have dimensions and be formed using methods that are analogous, equivalent or identical to the materials, dimensions and methods that are used for forming the spacer 24 that is illustrated within FIG. 1 and FIG. 1A. Such materials and methods will typically include silicon nitride materials for forming the second spacer 28 while using a blanket layer deposition and anisotropic etchback method.

FIG. 6, FIG. 6A, FIG. 6B and FIG. 6C shows the results of forming silicide layers 30 upon exposed surfaces of silicon containing structures within the schematic plan-view and cross-sectional diagrams of FIG. 5, FIG. 5A, FIG. 5B and FIG. 5C.

The silicide layers 30 are located upon the gate electrode 20', the source/drain regions 22" and the body contact region BCR portion of the surface semiconductor layer 14".

The silicide layers 30 may comprise silicide materials formed from any of several metal silicide forming metals. Included within the group of metal silicide forming metals are nickel, cobalt, titanium, tungsten, tantalum, platinum and vanadium metal silicide forming metals. Cobalt silicide materials and nickel silicide materials are particularly common silicide materials. Other silicide materials are not excluded.

Typically, the silicide layers 30 are formed using a blanket metal silicide forming metal layer deposition, thermal annealing and excess metal silicide forming metal layer stripping method. Appropriate etchants for stripping unreacted portions of metal silicide forming metals are generally selected in accordance within the context of specific metal silicide forming metals. Typically, each of the silicide layers 30 has a thickness from about 100 to about 400 angstroms.

FIG. 7, FIG. 7A, FIG. 7B and FIG. 7C show the results of further processing of the semiconductor structures of FIG. 6, FIG. 6A, FIG. 6B and FIG. 6C.

Figure 7:
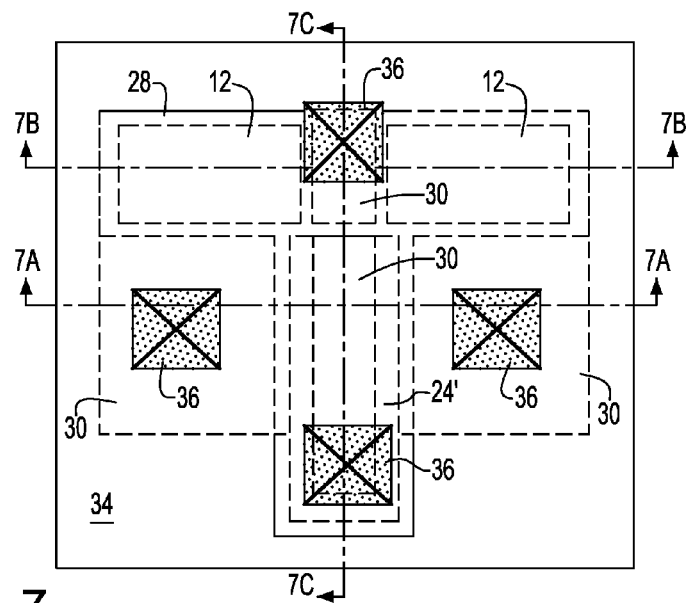
Figure 7A:
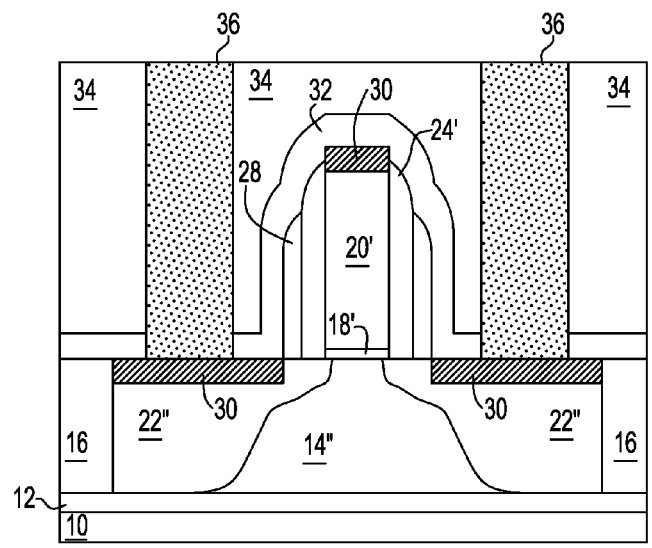
Figure 7B:
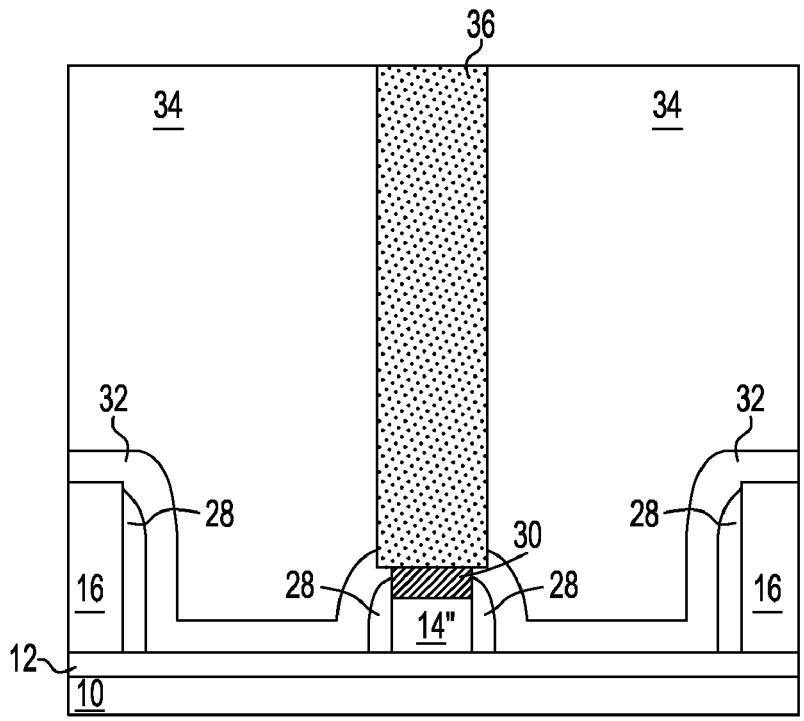
Figure 7C:
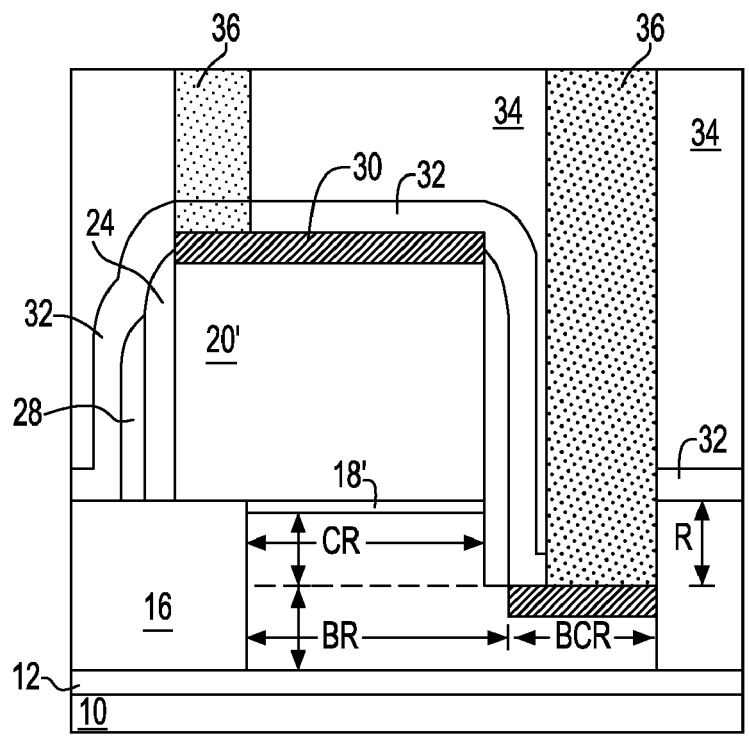

FIG. 7A, FIG. 7B and FIG. 7C in particular show a liner layer 32 located upon the semiconductor structures of FIG.

Figure 6A:
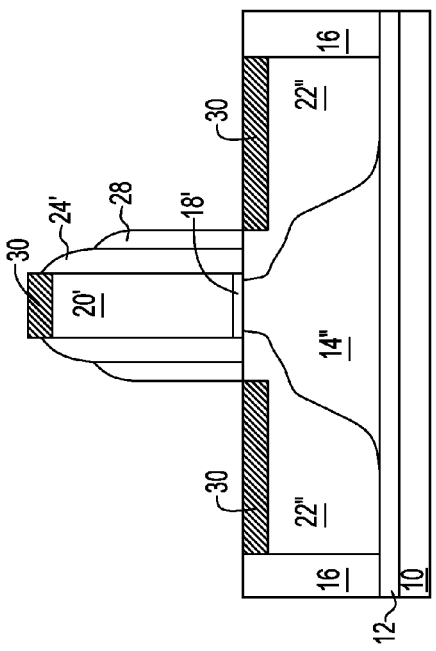
Figure 6C:
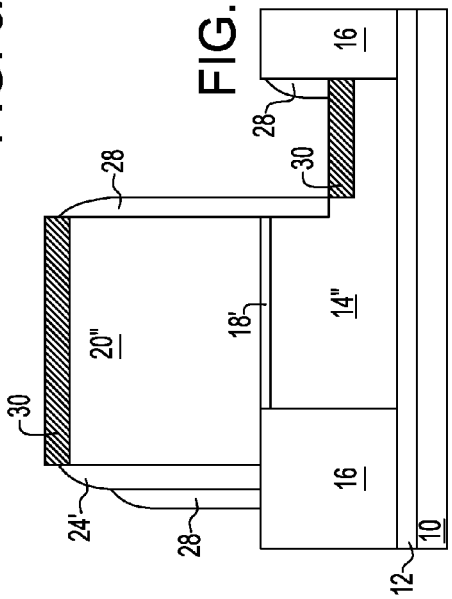
Figure 6:
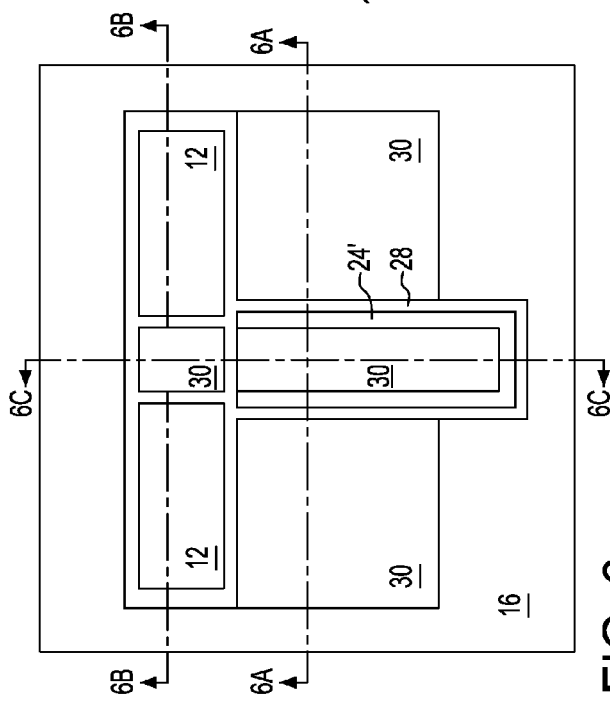
Figure 6B:
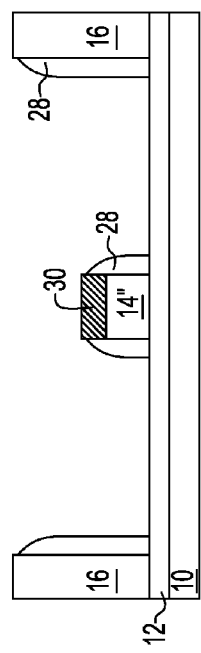

6A, FIG. 6B and FIG. 6C. Although the liner layer 32 may comprise any of several liner materials, including but not limited to silicon oxide liner materials and silicon nitride liner materials, preferably the liner layer 32 comprises a silicon nitride liner material. The liner layer 32 may be formed using methods including but not limited to chemical vapor deposition methods and physical vapor deposition methods. Typically, the liner layer 32 has a thickness from about 200 to about 1000 angstroms.

FIG. 7A, FIG. 7B and FIG. 7C also show a passivation layer 34 having conductor stud layers 36 penetrating through the passivation layer 34. The conductor stud layers 34 contact the silicide layers 30. The passivation layer 34 may comprise passivation materials generally analogous, equivalent or identical to the dielectric materials from which may be comprised the buried dielectric layer 12. Typically, the passivation layer 34 has a thickness from about 2000 to about 5000 angstroms. The conductor stud layers 36 may comprise conductor materials including but not limited to certain metals, metal alloys, metal nitrides and metal silicides, as well as polysilicon materials and polycide materials. Titanium, tungsten and tantalum metals are particularly common conductor stud materials. Tungsten is a most particular conductor stud material.

FIG. 7, FIG. 7A, FIG. 7B and FIG. 7C show schematic plan-view and cross-sectional diagrams of a semiconductor structure in accordance with a preferred embodiment of the invention. The semiconductor structure (see in particular FIG. 7C) comprises a metal oxide semiconductor field effect transistor having a body contact BCR region that extends from a body region BR and an overlying channel region CR within a surface semiconductor layer 14". The body contact region BCR is recessed below the channel region CR surface by a recess R having a recess distance from about 200 to about 400 angstroms. Such a recess R of the body contact region BCR beneath the channel region CR surface is intended to avoid a shorting of extension region portions of source/drain regions 22" to the body contact region BCR. The body contact region is also silicided with a silicide layer 30 to provide a low resistance electrical connection to the body contact region BCR.

The preferred embodiment is illustrative of the invention rather than limiting of the invention. Revisions and modifications may be made to methods, materials, structures and dimensions of a semiconductor structure in accordance with the preferred embodiment, while still providing a semiconductor structure in accordance with the invention, further in accordance with the accompanying claims.

What is claimed is:

1. A method for fabricating a semiconductor structure comprising:

forming a metal oxide semiconductor field effect transistor over a substrate, the metal oxide semiconductor field effect transistor including a gate electrode located over a body region and an overlying channel region within a semiconductor layer that separates a pair of source/drain regions located within the semiconductor layer;

masking a portion of the metal oxide semiconductor field effect transistor to leave exposed a portion of the source/drain regions and a portion of the gate electrode located over a portion of the channel region; and etching the exposed portions of the source/drain regions and the gate electrode, and the underlying channel region, to form a body contact region extending from the body region and recessed with respect to a surface of the channel region, said etching includes a two-step method comprising:

a first etch step for etching the gate electrode and the source/drain regions while using a gate dielectric as an etch stop to form a body contact region extending from the channel region; and a second etch step for etching the body contact region to form a recessed body contact region with respect to the surface of the channel region, and with the proviso that said etching does not include an oxidation step when forming the body contact region recessed with respect to the surface of the channel region.

* * * * *